(12) United States Patent
Macaluso

(10) Patent No.: US 6,326,832 B1
(45) Date of Patent: Dec. 4, 2001

(54) FULL SWING POWER DOWN BUFFER WITH MULTIPLE POWER SUPPLY ISOLATION FOR STANDARD CMOS PROCESSES

(75) Inventor: Steven M. Macaluso, Portland, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/537,314

(22) Filed: Mar. 29, 2000

(51) Int. Cl.[7] ...................................................... H03K 3/01
(52) U.S. Cl. ............................................ 327/534; 327/112
(58) Field of Search ........................ 326/83, 86; 327/108, 327/109, 110, 111, 112, 530, 534

(56) References Cited

U.S. PATENT DOCUMENTS

| | | |
|---|---|---|
| 5,451,889 * | 9/1995 | Heim et al. .............................. 326/81 |
| 5,539,335 * | 7/1996 | Kobayashi et al. ..................... 326/81 |
| 5,546,020 * | 8/1996 | Lee et al. ................................ 326/83 |
| 5,552,723 * | 9/1996 | Shigehara et al. ...................... 326/86 |
| 5,646,550 * | 7/1997 | Campbell, Jr. et al. ................ 326/81 |
| 6,118,301 * | 9/2000 | Singh et al. ............................. 326/58 |

* cited by examiner

Primary Examiner—Jeffrey Zweizig

(74) Attorney, Agent, or Firm—Stallman & Pollock LLP

(57) ABSTRACT

An output buffer circuit includes a pull-up output transistor formed in a well, the well isolated from the power supply only when a voltage exceeding the power supply voltage appears on the buffer output node. Isolation of the well is accomplished by linking the well to the power supply through an isolation transistor, such that the control node of the isolation transistor receives the output of a switching inverter utilizing the buffer output voltage as its high power rail. During normal operation, the output voltage is less than the power supply voltage and thus the output of the switching inverter is low. As a result, the isolation transistor is activated, and the well is pulled up to the power supply voltage. Appearance of a voltage greater than the circuit power supply on the buffer output node activates the switching inverter, raising the control voltage and deactivating the isolation transistor. In this manner, the well is isolated from the power supply rail. The buffer circuit further includes transmission gates positioned between the buffer input node and the output pull-down transistor. These transmission gates are controlled by the control voltage output by the switching inverter. During power down of the circuit, these transmission gates are deactivated by voltage applied to the buffer output node by a second buffer structure operating on the same bus. Deactivation of the transmission gates in this manner prevents voltages received on the buffer input node from activating the output pull-down transistor and creating a conductive pathway between the buffer output node and ground through the output pull-down transistor during power-down conditions.

11 Claims, 4 Drawing Sheets

FULL SWING POWER DOWN BUFFER WITH MULTIPLE POWER SUPPLY ISOLATION FOR STANDARD CMOS PROCESSES

BACKGROUND OF THE INVENTION

1. Field of the Invention

The present invention relates to an output buffer circuit and in particular, to an output buffer which isolates the well of an output pull-up transistor from a power supply utilizing a switching component fabricated from standard CMOS components.

2. Description of the Related Art

FIG. 1 shows a diagram of a conventional CMOS driver circuit 10 conveying signals to bus 12. Driver circuit 10 includes input node 14 receiving a digital input voltage signal of either a logical high value equal to the power supply voltage ($V_{cc}$) present on power supply rail 16, or a logical low value equal to ground 18.

Simple driver circuit 10 also includes PMOS pull-up transistor 20 featuring a gate, source, and drain. The gate is in electrical communication with input node 14. The source is in electrical communication with power supply rail 16. PMOS pull up transistor 20 is formed within N-well 22 also in electrical communication with power supply rail 16.

Driver circuit 10 further includes NMOS pull-down transistor 24 featuring a gate, source, and drain. The gate is in electrical communication with input node 14. The source is in electrical communication with ground 18. NMOS pull down transistor 24 is formed within P-type substrate 26 that is also grounded.

The drain of PMOS pull-up transistor 20 and the drain of NMOS pull-down transistor 24 are in electrical communication with each other and with output node 28. Output node 28 is in electrical communication with bus 12.

During operation of driver circuit 10, an input voltage signal is applied to the transistor gates through input node 14. The input voltage signal is either low (ground) or high (power supply voltage). Where the input voltage is equal to the voltage of power supply rail 16, the gate-to-source voltage ($V_{gs}$) of PMOS pull-up transistor 20 is zero, and PMOS pull-up transistor 20 is deactivated. At the same time, the $V_{gs}$ of NMOS pull-down transistor 24 is positive, and transistor 24 is activated. Thus where the input voltage signal is high, the drains of transistors 20 and 24 respectively are pulled to ground, and output node 28 exhibits low voltage.

Conversely, where the input voltage signal is zero, $V_{gs}$ of PMOS pull-up transistor 20 is negative and transistor 20 is activated. At the same time, $V_{gs}$ of NMOS pull-down transistor 24 is zero and transistor 24 is deactivated. Thus where the input voltage signal is low, the drains of transistors 20 and 24 respectively are pulled to the power supply voltage, and output node 28 exhibits high voltage. The two states of driver circuit 10 are summarized below in TABLE A:

TABLE A

| INPUT NODE | $P_{in}$ | $N_{in}$ | OUTPUT NODE |
|---|---|---|---|
| High | Off | On | Low |
| Low | On | Off | High |

Occasionally a need arises for more than one driver circuit to communicate on the same bus. Under these conditions, a driver circuit must be capable of operating in three states, with the driver circuit deactivated in the third state to permit other driver circuit(s) to communicate signals along the bus without interference.

Accordingly, FIG. 2 shows a conventional three-state driver circuit (also known as a high-impedance, or "high-Z", driver circuit). High-Z driver circuit 100 can be configured in a third, high impedance state, wherein a voltage on input node 114 is precluded from affecting a voltage on buffer output node 128.

Specifically, high-Z driver circuit 100 includes an output inverter 129 including PMOS output pull-up transistor 120 and NMOS output pull-down transistor 124. Output inverter 129 corresponds to the simple driver circuit 10 of FIG. 1. PMOS output pull-down transistor 120 is formed in N-well 122. Tri-state driver circuit 100 further includes pre-driver circuit 130 including input inverter 132 and first through fourth enable transistors 142, 144, 146, and 147 respectively.

Input inverter 132 includes PMOS input pull-up transistor 134. The gate of transistor 134 is in electrical communication with input node 114, and the source of transistor 134 is in electrical communication with power supply rail 116.

Input inverter 132 further includes NMOS input pull-down transistor 136. The gate of transistor 136 is in electrical communication with input node 114, and the source of transistor 136 is in electrical communication with ground 118. NMOS input pull-down transistor 136 is formed within P-type substrate 126 which is also grounded.

The drain of PMOS input pull-up transistor 134 and the drain of NMOS input pull-down transistor 136 form first and second conductive paths 138 and 140, respectively. The voltage appearing on conductive paths 138 and 140 is determined by first through fourth enable transistors 142, 144, 146 and 147, respectively.

The gates of first and second enable transistors 142 and 144 are connected to enable input node 148. The gates of third and fourth enable transistors 146 and 147 connected to enable inverse input node 150.

When enable input node 148 is high and enable inverse input node 150 is low, first enable transistor 142 and third enable transistor 146 are activated, and second enable transistor 144 and fourth enable transistor 147 are deactivated. This has the effect of placing the drains of transistors 134 and 136 in electrical communication, such that buffer circuit 130 operates in conjunction with output inverter circuit 129 in essentially the same manner as circuit 10 of FIG. 1. As described above in conjunction with FIG. 1, transistors 120 and 124 of output inverter 129 are then selectively activated/deactivated to convey an output voltage to output node 128 equal to the voltage on input node 114.

Conversely, when enable input 148 is low and enable inverse input 150 is high, driver circuit 100 is placed into a third configuration. In this third configuration, first and third enable transistors 142 and 146 are deactivated, and second and fourth enable transistors 144 and 147 are activated.

This third configuration has the effect of isolating first and second current paths 138 and 140 from one another. Moreover, because second enable transistor 144 is activated, first electrical path 138 between the drain of PMOS input pull-up transistor 134 and the gate PMOS output pull-up transistor 120 is raised to the power supply voltage on power supply rail 116. Because fourth enable transistor 147 is activated, second electrical pathway 140 is lowered to ground. When driver 100 is thus placed into the third state, appearance of a voltage signal at input node 114 will not affect the voltage at buffer output node 128. High-Z driver circuit 100 is thus inactive while second buffer structure 152 communications along bus 112. Operation of the high-Z buffer circuit of FIG. 2 is summarized in TABLE B below:

at the interface between the P+drain and the N-well of the output pull-up transistor may become forward-biased. Because the N-well is connected to the power supply rail,

TABLE B

| INPUT NODE | ENABLE | ENABLE INVERSE | TRANS. 134 | TRANS. 136 | TRANS. 142 & 146 | TRANS. 144 & 148 | PATH 1 | PATH 2 | TRANS. 120 | TRANS. 124 | OUTPUT NODE |
|---|---|---|---|---|---|---|---|---|---|---|---|
| High | High | Low | Off | On | On | Off | Low (GND) | Low (GND) | On | Off | High |
| Low | High | Low | On | Off | On | Off | High ($V_{cc}$) | High ($V_{cc}$) | Off | On | Low |
| High | Low | High | Off | On | Off | On | High ($V_{cc}$) | Low (GND) | Off | Off | Z |
| Low | Low | High | On | Off | On | Off | High ($V_{cc}$) | Low (GND) | Off | Off | Z |

While the high-Z driver circuit described above in FIG. 2 is suitable for some applications, it has a number of serious disadvantages.

One problem with the conventional buffer architecture becomes apparent during power down of the circuit.

Referring back to FIG. 2, in a power down situation the voltage appearing on power supply rail 116 may be at or close to ground, while a voltage is conveyed to input node 114 by an active device. Under such power down conditions, pre-driver circuit 130 may communicate a corresponding input voltage to the gate of NMOS output pull-down transistor 124. Simultaneously, it is possible that second buffer structure 152 could transmit a voltage signal on bus 112, thereby causing this voltage to appear on buffer output node 128. Under the power-down conditions just described, the gate-to-source voltage ($V_{gs}$) of output NMOS pull-down transistor 124 would be positive, activating transistor 124 and causing a flow of current from buffer output node 128 into ground. This unwanted current flow can strain transistor 124 and reduce the voltage at output node 128, possibly disrupting communication by second buffer structure 152 along bus 112.

Therefore, there is a need in the art for a buffer structure which prevents unwanted activation of the output pull-down transistor during power down conditions which could create a current path between the buffer output node and ground.

Another problem with the conventional buffer architecture becomes apparent when a high voltage appears at the output node. Specifically, where driver circuit 100 of FIG. 2 is operating on bus 112 with a second buffer structure 152, a voltage may appear on bus 112 (and hence at buffer output node 128 of the driver circuit 100) in excess of the power supply voltage ($V_{CC}$). This can occur, for example, when second buffer structure 152 utilizes a power supply voltage greater than $V_{CC}$.

Appearance of such an elevated voltage on the buffer output node poses several dangers.

One danger is that the PMOS output pull-up transistor may turn on, enabling current to flow from the drain through the channel to the source. In this manner, voltage limits of the internal transistors of the buffer structure may be exceeded, leading to irreversible device damage and failure.

Therefore, there is a need in the art for a high-Z buffer structure which prevents activation of the output pull-up transistor in the third, high impedance state as could be caused by the appearance of a high voltage on the buffer output node.

A second danger posed by the appearance of a high voltage on the output node is that the P/N junction formed forward-biasing the drain-well P/N junction would result in a flow of current into the power supply rail, disrupting and destabilizing the power supply voltage.

This is illustrated in FIGS. 3A–3B, which depict cross-sectional views of PMOS output pull-up transistor 120 of driver circuit 100 of FIG. 2. In FIG. 3A, PMOS output pull-up transistor 120 is operating under normal conditions, wherein the voltage on buffer output node 128 is less than or equal to the voltage on power supply rail 116. Application of a low voltage signal to gate 120a of PMOS output pull-up transistor 120 activates transistor 120, such that current flows from power supply 116 through source 120b to output node 128.

FIG. 3B illustrates abnormal operating conditions, wherein a voltage exceeding that of power supply rail 116 appears on output node 128. PMOS output pull-up transistor 120 is formed within N-well 122, and N-well 122 is tied to source 120a. High voltage on output node 128 may forward-bias the P/N junction between drain 120c of transistor 120 and N-well 122. This forward-biasing may result in current flow from drain 120c through N-well 122 into power supply rail 116, posing a number of serious problems for the buffer structure. These problems include destabilization of the power supply voltage and possible device failure.

Therefore, there is a need in the art for a buffer structure which prevents forward-biasing of the P/N diode at the P+ drain/N-well interface of the output pull-up transistor that can lead to disruption of the power supply voltage.

One approach to solving the above-described problem is proposed in U. S. Pat. No. 5,338,978 to Larsen et al. ("the Larsen Patent"). The general operation of the buffer of the Larsen Patent is depicted in FIG. 4.

Buffer circuit 400 includes output pull-up PMOS transistor PT1 formed in N-well 422. First switch 459 is interposed between buffer output node 428 and the gate of output pull-up PMOS transistor PT1. First switch 459 is activated when the voltage on buffer output node 428 exceeds the power supply voltage $V_{CC}$.

Second switch 460 is interposed between N-well 422 and power supply rail 416. Second switch 460 is manipulable to selectively isolate N-well 422 from power supply rail 416 based upon the voltage present on the gate of output pull-up PMOS transistor PT1.

When voltage $V_{OUT}$ on buffer output node 428 rises above the buffer supply $V_{CC}$, first switch 459 is activated. This causes the voltage on the gate of output pull-up transistor PT1 to rise to $V_{OUT}$, in turn deactivating second switch 460 and isolating N-well 422 from power supply 416.

While the buffer structure proposed by the Larsen Patent is suitable for some applications, it suffers from a number of important disadvantages.

For example, deactivation of second switch 460 to isolate N-well 422 from power supply 416 is controlled by the voltage on the gate of output pull-up transistor PT1. While the voltage on the gate of output pull-up PT1 changes when $V_{OUT}>V_{CC}$ and first switch 459 is activated, the voltage on the gate of output pull-up transistor PT1 also changes with the voltage present on input node 414. Second switch 460 thus receives a constantly-changing input signal regardless of the actual magnitude of $V_{OUT}$. Where input node 414 is at the power supply $V_{CC}$, second switch 460 is close to deactivation.

Therefore, there is a need in the art for a buffer structure which isolates the well containing the output transistor independent of the voltage present on the buffer input node and only when the voltage on the buffer output node exceeds the buffer power supply.

SUMMARY OF THE INVENTION

The present invention relates to an output buffer structure including an output pull-up transistor formed in a well, wherein the well is selectively isolated from the high voltage power supply only when a voltage greater than the power supply voltage appears on the buffer output node. Isolation of the well is accomplished by interposing an isolation transistor between the N-well and the power supply rail. The gate of the isolation transistor receives the output of a CMOS switching inverter which utilizes the output voltage as a power supply rail.

During normal circuit operation, voltage on the buffer output node is less than or equal to the power supply voltage, and thus the output of the switching inverter is low. As a result, the isolation transistor is activated and the well is connected with the power supply voltage.

Appearance of a voltage greater than the power supply at the output node activates the switching inverter, raising voltage on the gate of the isolation transistor and thereby deactivating the isolation transistor. Deactivation of the isolation transistor isolates the well from the power supply rail.

An apparatus in accordance with one embodiment of the present invention comprises an output device formed at least partially in a well of a semiconductor workpiece, the output device including an input node and an output node. The apparatus further comprises a power supply rail configured to output a power supply voltage to the well, and an isolation circuit positioned between the well and the power supply, the isolation circuit permitting electrical communication between the power supply and the well only when a voltage on the output node of the output device is smaller than the power supply voltage.

In an apparatus including an output device formed at least partially in a well of a semiconductor workpiece and including an input node and an output node, the output device also including a power supply configured to output a power supply voltage to the well, a method of preventing an output voltage in excess of the power supply voltage on the output node from disrupting the power supply voltage comprises the step of deactivating an isolation circuit between the power supply and the well in order to block electrical communication between the power supply and the well only when a voltage at the output node of the output device exceeds the power supply voltage.

The features and advantages of the present invention will be understood upon consideration of the following detailed description of the invention and the accompanying drawings.

DETAILED DESCRIPTION

The present invention relates to an output buffer structure including an output pull-up transistor formed in a well, wherein the well is isolated from the voltage power supply only when a voltage exceeding the power supply voltage appears on the buffer output node. Isolation of the well is accomplished by tying the well to the output node of an isolation transistor, wherein the control node of the isolation transistor is controlled by a switching inverter which utilizes the output voltage as its power supply rail.

Figure 3A:
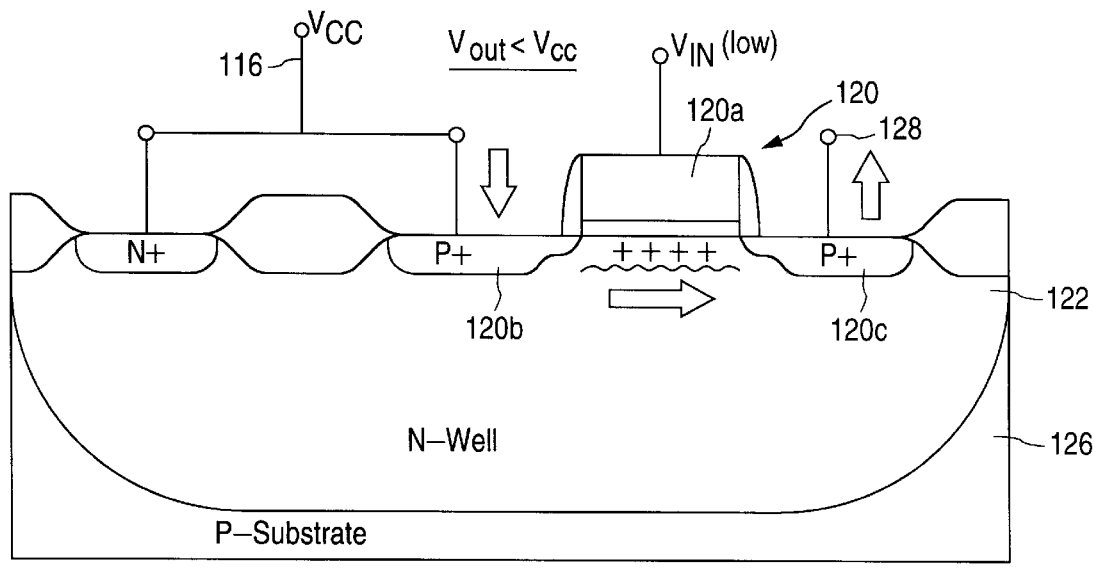
FIG. 3A shows a cross-sectional view of the PMOS output pull-up transistor of FIG. 2 during normal operating conditions, with $V_{OUT}<V_{CC}$.
Figure 3B:
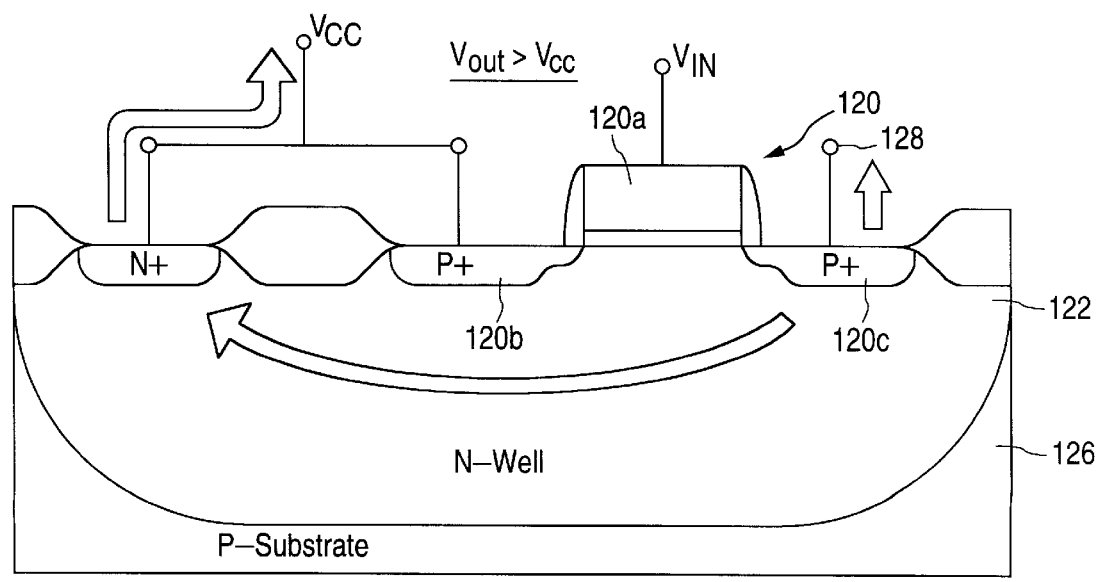
FIG. 3B shows a cross-sectional view of the PMOS output pull-up transistor of FIG. 2 during abnormal operating conditions, with $V_{OUT}>V_{CC}$.
Figure 4:
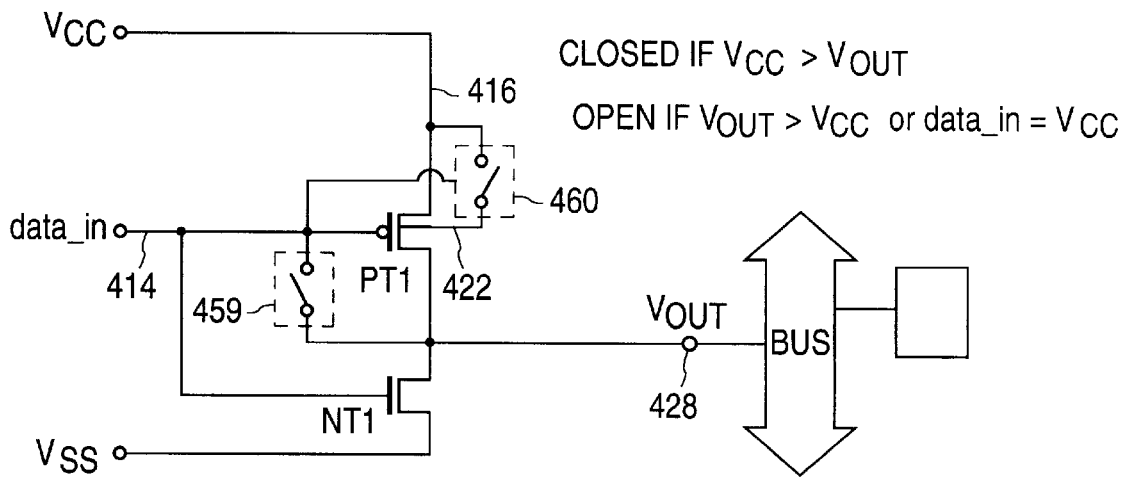
FIG. 4 shows the approach of U.S. Pat. No. 5,338,978 for constructing a simple driver circuit.
Figure 5:
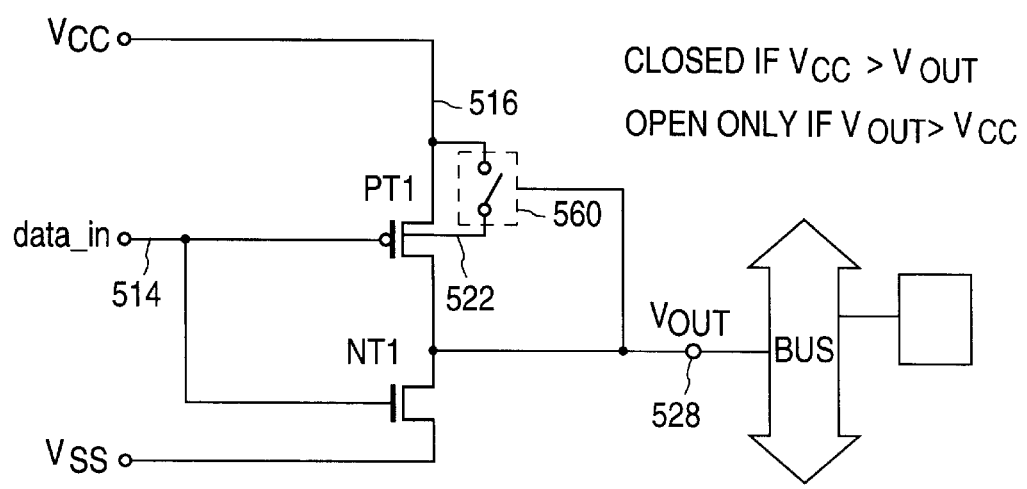
FIG. 5 shows a schematic diagram of a simple driver circuit in accordance with one embodiment of the present invention.

FIG. 5 shows a solution to the reverse-biasing well problem described in FIG. 3B in accordance with one embodiment of the present invention. Switch 560 is interposed between N-well 522 and power supply rail 516. Switch 560 is manipulable to selectively isolate N-well 522 from power supply rail 516 regardless of the voltage on input node 514 and only when the voltage on output node 528 exceeds that of power supply rail 516.

Figure 6:
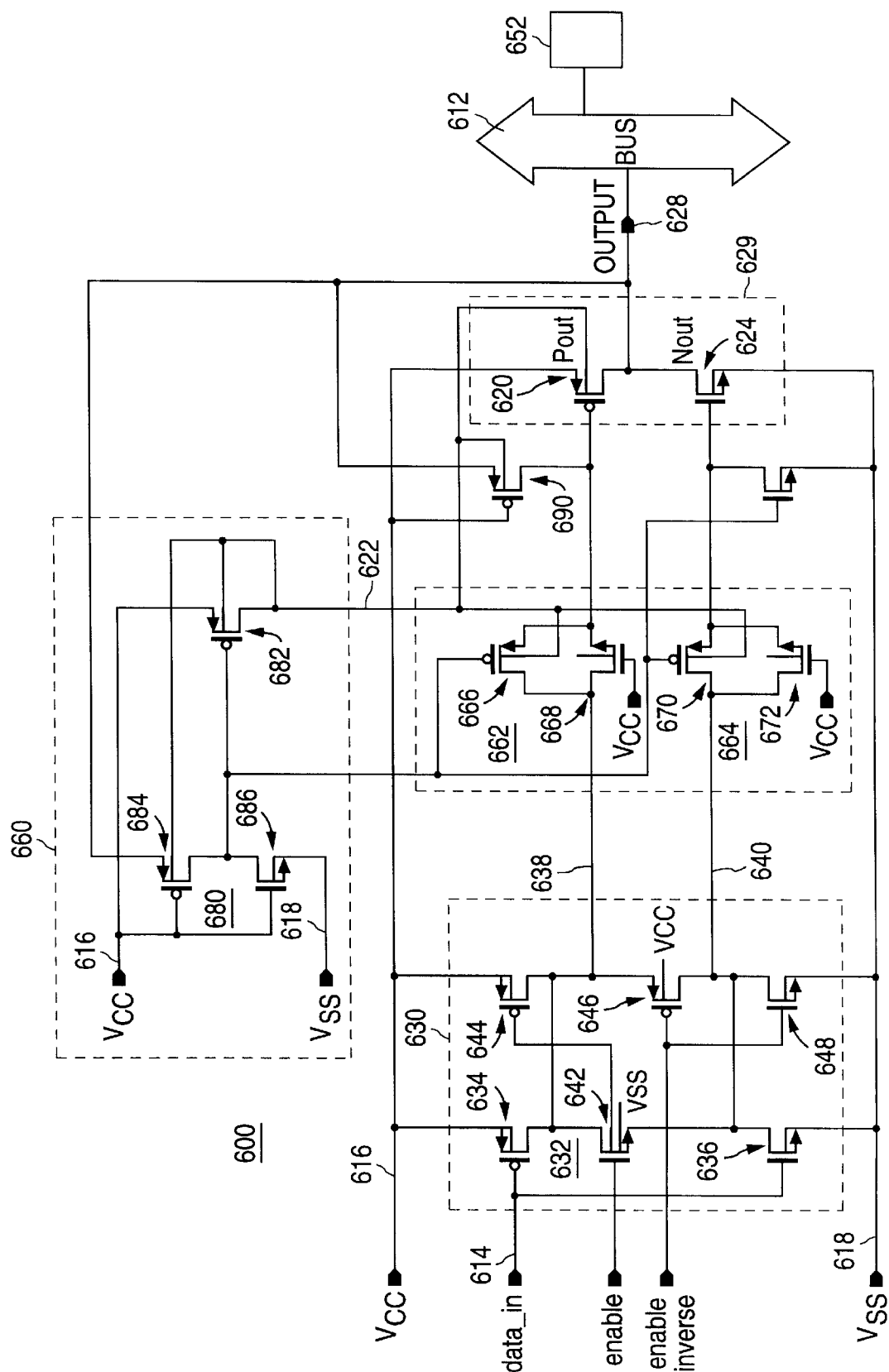
FIG. 6 shows a circuit diagram of an output buffer structure in accordance with the embodiment of the present invention shown in FIG. 5.

FIG. 6 shows a circuit diagram of an output buffer circuit in accordance with the embodiment shown in FIG. 5. Output buffer structure includes output node 628 in electrical communication with bus 612. Second buffer structure 652 is also in electrical communication with bus 612.

Figure 1:
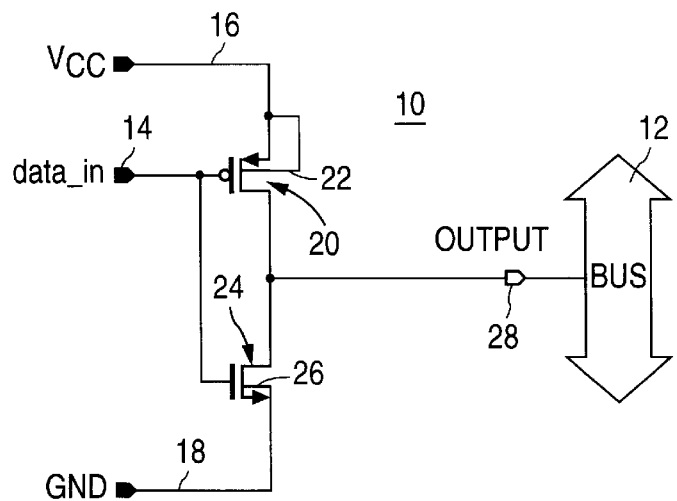
FIG. 1 shows a circuit diagram of a simple conventional CMOS driver circuit.
Figure 2:
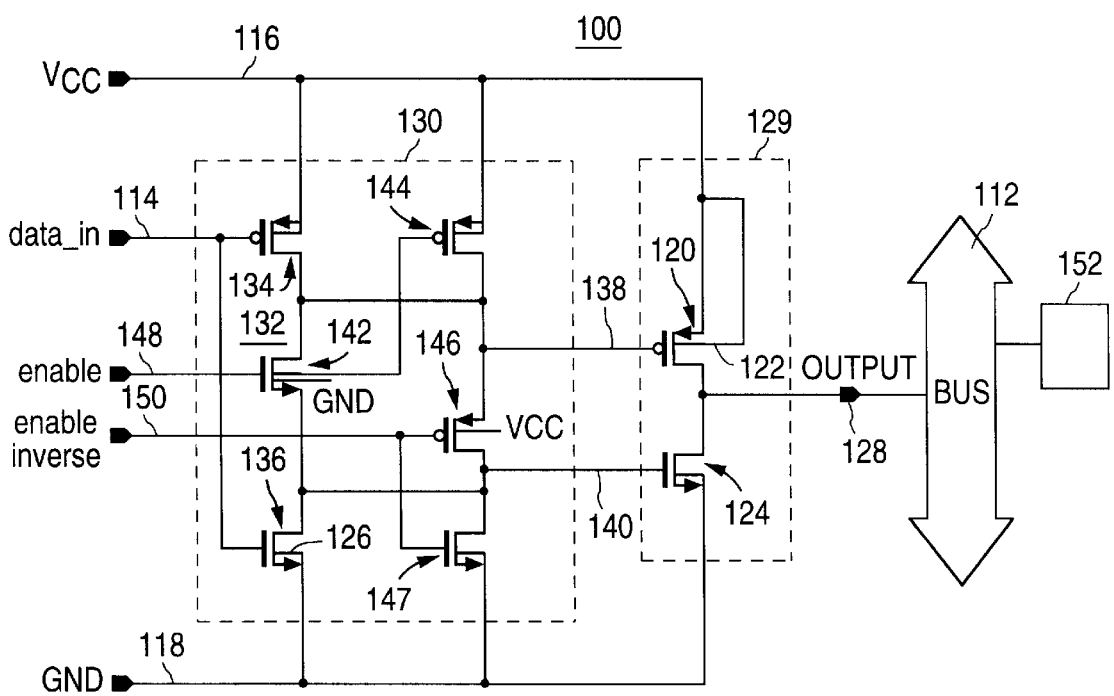
FIG. 2 shows a circuit diagram of a conventional high-Z output buffer structure.

Output buffer structure 600 includes pre-driver circuit 630 including input inverter 632 and first, second, third, and fourth enable transistors 642, 644, 646, 648, respectively. Pre-driver circuit 630 is the same as the pre-driver circuit illustrated and described in conjunction with the conventional buffer structure of FIG. 2. Pre-driver circuit 630 communicates voltage signals along first and second conductive paths 638 and 640.

Output buffer structure 600 further includes switching component 660 comprising CMOS switching inverter 680 and PMOS isolation transistor 682. Isolation transistor 682 is positioned between N-well 622 and high voltage power supply rail 616. PMOS isolation transistor 682 is controlled by CMOS switching inverter 680.

CMOS switching inverter 680 comprises PMOS pull-up switching transistor 684 and NMOS pull-down switching transistor 686. The gates of switching transistors 684 and 686 are tied to high voltage supply rail 616. The source of PMOS pull-up switching transistor 684 is in electrical communication with output node 628. The source of NMOS pull-down switching transistor 686 is in electrical communication with ground 618. The drains of transistors 684 and 686 are in electrical communication with each other and with the gate of PMOS isolation transistor 682.

The source of PMOS isolation transistor 682 is in electrical communication with high voltage supply rail 616. The drain of PMOS isolation transistor is in electrical communication with N-well 622.

Output buffer structure 600 further includes transmission gates 662 and 664 located on first and second conductive paths 638 and 640 between predriver circuit 630 and output driver 629. Specifically, first transmission gate 662 is positioned between the drain of PMOS input pull-up transistor 634 and the gate of PMOS output pull-up transistor 620. Second transmission gate 664 is positioned between the drain of NMOS input pull-down transistor 636 and the gate of NMOS output pull-down transistor 624.

First transmission gate 662 includes PMOS transmission transistor 666 in parallel with NMOS transmission transistor 668. The drain of PMOS transmission transistor 666 and the drain NMOS of transmission transistor 668 are in electrical communication with the drain of PMOS input pull-up transistor 634. The source of PMOS transmission transistor 666 and the source of NMOS transmission transistor 668 are in electrical communication with the gate of PMOS output pull-up transistor 620. The gate of PMOS transmission transistor 666 receives the output of switching inverter 680 and the bulk of PMOS transmission transistor is tied to N-well 622. The gate of NMOS transmission transistor 668 is connected with power supply rail 616. The bulk of transistor 668 is grounded to the P-type substrate.

Second transmission gate 664 includes PMOS transmission transistor 670 in parallel with NMOS transmission transistor 672. Drain of PMOS transmission transistor 670 and drain of NMOS transmission transistor 672 are in electrical communication with the drain of NMOS input pull-down transistor 636. The source of PMOS transmission transistor 670 and the source of NMOS transmission transistor 672 are in electrical communication with the gate of NMOS output pull-down transistor 624. The gate of PMOS transmission transistor 670 receives the output of switching inverter 680. The bulk of PMOS transmission transistor 670 is tied to N-well 622. The gate of NMOS transmission transistor 672 is grounded, and the bulk of NMOS transmission transistor 672 is grounded to the P-type substrate.

Output buffer structure 600 further includes PMOS feedback transistor 690. PMOS feedback transistor 690 has its drain in electrical communication with first conductive path 638. The source of feedback transistor 690 is in electrical communication with output node 628. The gate of feedback transistor 690 is in electrical communication with power supply rail 616.

Under normal, enabled operating conditions, the voltage present on first and second conductive paths 638 and 640 is either high or low, depending upon the voltage applied to buffer input node 614. The voltage at buffer output node 628 is equal to or less than the power supply voltage. Feedback PMOS transistor 690 is thus deactivated, as its $V_{gs}$ is greater than or equal to zero. PMOS pull-up switching transistor 684 of switching inverter 680 is also deactivated, and isolation transistor 682 remains activated because the voltage applied to its gate by inverter 680 is low.

Appearance of an abnormally high ($>V_{CC}$) voltage at output node 628 of buffer circuit 600 causes the following series of events to occur.

First, feedback transistor 690 becomes activated, as the voltage on the source exceeds that on the gate. Feedback transistor 690 then conveys the high output voltage along first conducting path 638 to the gate of output pull-up PMOS transistor 620. Because $V_{gs}$ of PMOS output pull-up transistor 620 is assured of being zero (the gate and source are tied together through feedback transistor 690), no conducting channel will form in PMOS output pull-up transistor 620. In this manner, undesirable reverse biasing of PMOS output pull-up transistor 620 is avoided.

Another consequence of the appearance on output node 628 of a voltage exceeding the power supply voltage is isolation of N-well 622 from power supply rail 616. Specifically, where the output voltage rises above the power supply voltage, PMOS pull-up switching transistor 684 of switching inverter 680 is activated, and the voltage on output node 628 is conveyed to the gate of isolation transistor 682. Because $V_{gs}$ of PMOS isolation transistor 682 becomes positive, PMOS isolation transistor 682 is deactivated and N-well 622 is isolated from power supply rail 616. High voltage on output node 628 is thus prevented from disrupting the voltage on power supply rail 616.

Operation of output buffer structure 600 to prevent current flow into the power supply rail is summarized below in TABLES C and D:

TABLE C

| | | | NORMAL OPERATION ($V_{OUT} < V_{CC}$) | | | | | |
|---|---|---|---|---|---|---|---|---|
| CONDITION | PATH 538 | TRANS. 584 | TRANS. 586 | TRANS. 582 | TRANS. 590 | $V_{N-WELL}$ | TRANS. 520 | OUTPUT NODE |
| $V_{OUT} < V_{CC}$ | HIGH | OFF | ON | OFF | OFF | HIGH ($V_{CC}$) | OFF | LOW (GND) |
| $V_{OUT} < V_{CC}$ | LOW | OFF | ON | OFF | VERY OFF | HIGH ($V_{CC}$) | ON | HIGH ($V_{CC}$) |

TABLE D

| | | | $V_{OUT} > V_{CC}$ | | | | | |
|---|---|---|---|---|---|---|---|---|
| CONDITION | OUTPUT NODE 528 | TRANS. 590 | PATH 1 | TRANS. 520 | TRANS. 584 | TRANS. 586 | TRANS. 582 | $V_{WELL}$ |
| $V_{OUT} > V_{CC}$ | HIGH ($V_{OUT}$) | ON | HIGH ($V_{OUT}$) | OFF | ON | OFF | OFF | FLOAT |

Apart from disconnecting N-well 622 from power supply rail 616, switching component 660 of buffer structure 600 also functions to prevent unwanted activation of NMOS output pull-down transistor 624 in power down situations. To understand this, recall that PMOS pull-up switching transistor 684 will be activated when its $V_{gs}$ is a negative value. This may occur where the voltage on its source exceeds that of its gate, as described above where the voltage at buffer output node 628 exceeds the power supply voltage.

However, $V_{gs}$ of PMOS pull-up switching transistor 684 may also be negative when the voltage applied to its gate is low, as occurs during power down conditions where $V_{CC}$ is zero.

The embodiment of the present invention shown in FIG. 6 utilizes this characteristic of switching component 660 to prevent unwanted activation of NMOS output pull-down transistor 624 during power down situations. Specifically, the gates of PMOS transmission transistors 666 and 670 of first and second transmission gates 662 and 664 respectively, are connected to the output of switching inverter 680.

Under normal operating conditions, $V_{CC}$ is a positive voltage and some positive voltage is applied to buffer output node 628 by bus 612. Transmission transistors 666 and 668 of first transmission gate 662, and transmission transistors 670 and 672 of second transmission gate 664, are activated. A voltage at input node 614 causes a corresponding voltage to at output inverter 629 via first and second conductive paths 638 and 640.

However, in power-down situations where $V_{CC}$ is zero, transmission transistors 666 and 668 of first transmission gate 662 and transmission transistors 670 and 672 of second transmission gate 664 are deactivated. A voltage signal is blocked from being communicated from input node 614 through first and second conductive paths 638 and 640 to output inverter 629. As a result, a received voltage on input node 614 of powered-down buffer structure 600 cannot activate NMOS output pull-down transistor 624. In this manner, switching component 660 also serves to prevent the flow of current from the output node to ground through output pull-down transistor 624 during power down conditions. This aspect of operation of the present invention is summarized below in TABLE E:

received on the buffer input node during device power-down without the need for an additional power source. Rather, the present invention utilizes voltage on the buffer output node due to activity by another device on the same bus, to deactivate transmission gates intervening between the input node and the output pull-down transistor.

Although the invention has been described in connection with one specific preferred embodiment, it must be understood that the invention as claimed should not be unduly limited to this embodiment. Various other modifications and alterations in the structure and process will be apparent to those skilled in the art without departing from the scope of the present invention.

For example, while the above discussion describes a buffer circuit employing a switching component which simultaneously isolates the N-well from the power supply and isolates the output pull-down device from the input node, this is not required by the present invention. A buffer structure functioning only to isolate the power supply from the N-well would also fall within the scope of the present invention.

Moreover, while the particular embodiment of the present invention illustrated in FIG. 6 includes PMOS pull-up switching and output transistors, and PMOS feedback and isolation transistors formed in an N-well created in a P-type silicon substrate, the present invention is not limited to this embodiment. A buffer circuit utilizing NMOS output, switching, feedback, and isolation transistors formed in a P-well created in an N-type silicon substrate would also fall within the scope of the present invention. Of course, the relative voltages would be reversed as compared with the embodiment described above in connection with FIG. 6.

Furthermore, while the embodiment shown in FIG. 6 utilizes components fabricated exclusively from MOS transistor devices, a circuit could also employ bipolar transistor devices to perform some or all of the functions described above and would still remain within the scope of the present invention.

Given the above description and the variety of embodiments described therein, it is intended that the following claims define the scope of the present invention, and that the processes within the scope of these claims and their equivalents be covered hereby.

TABLE E

| CONDITION | $V_{CC}$ | OUTPUT NODE 628 | TRANS. 684 | TRANS. 686 | TRANS. 666 | TRANS. 668 | TRANS. 670 | TRANS. 672 | RESULT |
|---|---|---|---|---|---|---|---|---|---|
| NORMAL OPERATION | $V_{CC}$ (>0) | >0 | OFF | ON | ON | ON | ON | ON | VOLTAGE COMMUNICATED ON PATHS 638 AND 640 |
| POWER DOWN | 0 | >0 | ON | ON | OFF | OFF | OFF | OFF | VOLTAGE NOT COMMUNICATED ON PATHS 638 AND 640 |

The output buffer structure in accordance with the present invention offers a number of important advantages. One important advantage is that isolation of the power supply rail from the N-well is accomplished by the switching component only when voltage appearing on the output node exceeds that of the power supply. This switching function is independent of internal voltages occurring within the circuit under normal operating conditions.

Another advantage of the output buffer structure in accordance with the present invention is that the pull-down transistor of the output inverter is isolated from voltages

What is claimed is:

1. An apparatus comprising:
   an output device formed at least partially in a well of a semiconductor workpiece, the output device including an input node and an output node;
   a power supply rail configured to output a power supply voltage to the well; and
   an isolation circuit positioned between the well and the power supply, the isolation circuit permitting electrical communication between the power supply and the well only when a voltage on the output node of the output device is smaller than the power supply voltage; and wherein the output device includes an output inverter comprising:
   a pull-up output transistor formed in the well, the pull-up output transistor having a control node in electrical communication with the input node of the output device, an input node in electrical communication with the power supply rail, and an output node in electrical communication with the output node of the output device; and
   a pull-down output transistor formed outside of the well, the pull-down transistor having a control node in electrical communication with the input node of the output device, an input node in electrical communication with a low power rail, and an output node in electrical communication with the output node of the output device; and wherein the isolation circuit comprises:
   a switching inverter including,
      a pull-up switching transistor having a control node in electrical communication with the power supply rail, an input node in electrical communication with the output node of the output device, and
      a pull-down switching transistor having a control node in electrical communication with the power supply rail, and an input node in electrical communication with the low power rail; and
   an isolation transistor including,
      a control node in electrical communication with an output node of the pull-up switching transistor and an output node of the pull-down switching transistor,
      an input node in electrical communication with the power supply rail, and
      an output node in electrical communication with the well, whereby application of an output voltage exceeding the power supply voltage to the output node of the output device causes the switching inverter to apply a control voltage to the control node of the isolation transistor, thereby deactivating the isolation transistor and isolating the well from the power supply rail.

2. An apparatus according to claim 1, and wherein:
   the well is N-type;
   the pull-up output transistor, the pull-up switching transistor, and the isolation transistor are PMOS devices formed within the well and have a gate as the control node, a source as the input node, and a drain as the output node; and
   the pull-down output transistor and the pull-down switching transistor are NMOS devices formed outside of the well and have a gate as the control node, the source as the input node, and the drain as the output node.

3. An apparatus according to claim 1, and wherein:
   the well is P-type;
   the pull-up output transistor, the pull-up switching transistor, and the isolation transistor are NMOS devices formed within the well and have a gate as the control node, a source as the input node, and a drain as the output node; and
   the pull-down output transistor and the pull-down switching transistor are PMOS devices formed outside of the well and having the gate as the control node, the source as the input node, and the drain as the output node.

4. An apparatus according to claim 1, and further comprising:
   a pre-driver circuit positioned between the input node of the output device and the output inverter, the pre-driver circuit in electrical communication with the control node of the pull-up output transistor through a first conductive pathway and in electrical communication with the control node of the pull-down output transistor through a second conductive pathway;
   a first transmission gate positioned on the first conductive pathway between the pre-driver circuit and the control node of the output pull-up transistor, the first transmission gate controlled by the control voltage; and
   a second transmission gate positioned on the second conductive pathway between the pre-driver circuit and the control node of the output pull-down transistor, the second transmission gate controlled by the control voltage.

5. An apparatus according to claim 4, and wherein:
   the first transmission gate comprises,
      a first transmission transistor having a control node in electrical communication with the inverter output node, an input node in electrical communication with the first conductive pathway, and an output node in electrical communication with the control node of the pull-up output transistor, and
      a second transmission transistor having a control node in electrical communication with the power supply rail, an input node in electrical communication with the first conductive pathway, and an output node in electrical communication with the control node of the pull-up output transistor; and
   the second transmission gate comprises,
      a third transmission transistor having a control node in electrical communication with the inverter output node, an input node in electrical communication with the second conductive pathway, and an output node in electrical communication with the control node of the pull-up output transistor, and
      a fourth transmission transistor having a control node in electrical communication with the power supply rail, an input node in electrical communication with the second conductive pathway, and an output node in electrical communication with the control node of the pull-up output transistor, whereby application of an output voltage exceeding the power supply voltage to the output node of the output device causes the switching inverter to apply a control voltage to the control nodes of the first and third transmission transistors, thereby deactivating the first and second transmission transistors and preventing a signal from flowing from the output node of the output device through the first and second conductive pathways to the output inverter.

6. An apparatus according to claim 5, and wherein:
   the well is N-type;
   the pull-up output transistor, the pull-up switching transistor, the isolation transistor, and the first and third transmission transistors are PMOS devices formed within the well and have a gate as the control node, a source as the input node, and a drain as the output node; and
   the pull-down output transistor, the pull-down switching transistor, and the second and fourth transmission transistors are NMOS devices formed outside of the well and have a gate as the control node, a source as the input node, and a drain as the output node.

7. An apparatus according to claim 5, and wherein:

the well is P-type;

the pull-up output transistor, the pull-up switching transistor, the isolation transistor, and the first and third transmission transistors are NMOS devices formed within the well and have a gate as the control node, a source as the input node, and a drain as the output node; and the pull-down output transistor, the pull-down switching transistor, and the second and fourth transmission transistors are PMOS devices formed outside of the well and have a gate as the control node, a source as the input node, and a drain as the output node.

8. An apparatus according to claim 1, and further comprising:

a feedback transistor formed in the well, the feedback transistor having a control node in electrical communication with the power supply rail, an input node in electrical communication with the output node of the output device, and an output node in electrical communication with the control node of the pull-up output transistor, whereby application of an output voltage exceeding the power supply voltage to the buffer output node activates the feedback transistor and allows the power supply voltage to be communicated to the control node of the pull-up output transistor, thereby preventing reverse biasing of the pull-up output transistor.

9. An apparatus according to claim 8, and wherein:

the well is N-type;

the pull-up output transistor, the pull-up switching transistor, the isolation transistor, and the feedback transistor are PMOS devices formed within the well and have a gate as the control node, a source as the input node, and a drain as the output node; and the pull-down output transistor and the pull-down switching transistor are NMOS devices formed outside of the well and have a gate as the control node, a source as the input node, and a drain as the output node.

10. An apparatus according to claim 8, and wherein:

the well is P-type;

the pull-up output transistor, the pull-up switching transistor, the isolation transistor, and the feedback transistor are NMOS devices formed within the well and have a gate as the control node, a source as the input node, and a drain as the output node; and the pull-down transistor and the pull-down switching transistor are PMOS devices formed outside of the well and have a gate as the control node, a source as the input node, and a drain as the output node.

11. In an apparatus including an output device formed at least partially in a well of a semiconductor workpiece and including an input node and an output node, the output device also including a power supply configured to output a power supply voltage to the well, a method of preventing an output voltage in excess of the power supply voltage on the output node from disrupting the power supply voltage, the method comprising the step of:

deactivating an isolation circuit between the power supply and the well in order to block electrical communication between the power supply and the well only when a voltage at the output node of the output device exceeds the power supply voltage; and wherein the step of deactivating an isolation circuit comprises:

generating a control voltage; and applying the control voltage to a control node of an isolation transistor having an input node in electrical communication with the power supply voltage and an output node in electrical communication with the well, such that the isolation transistor is deactivated; and wherein:

the step of generating a control voltage comprises:

applying the power supply voltage to a control node of a pull-up transistor of a switching inverter and to a control node of a pull-down transistor of the switching inverter, and applying the output voltage at the output node of the output device to an input node of the pull-up transistor of the switching inverter such that when the voltage at the output node of the output device exceeds the power supply voltage the control voltage is generated by the switching inverter; and the step of applying the control voltage to a control node of a switching transistor comprises applying the control voltage to a gate of a MOS transistor having one of a source and a drain in electrical communication with a power supply rail and the other of the source and the drain in electrical communication with the well.

* * * * *